(12) United States Patent
Nei

(10) Patent No.: US 6,597,018 B2
(45) Date of Patent: Jul. 22, 2003

(54) SEMICONDUCTOR LIGHT EMITTER AND FLAT PANEL DISPLAY LIGHTING SYSTEM

(75) Inventor: Masami Nei, Kagoshima (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 60 days.

(21) Appl. No.: 09/959,940

(22) PCT Filed: Mar. 16, 2001

(86) PCT No.: PCT/JP01/02141

§ 371 (c)(1),
(2), (4) Date: Nov. 13, 2001

(87) PCT Pub. No.: WO01/69693

PCT Pub. Date: Sep. 20, 2001

(65) Prior Publication Data

US 2002/0158257 A1 Oct. 31, 2002

(30) Foreign Application Priority Data

Mar. 17, 2000 (JP) .......................................... 2000-076211

(51) Int. Cl.[7] .................................................. H01L 27/15
(52) U.S. Cl. ........................... 257/79; 250/552; 257/84; 257/85; 257/99; 257/603; 438/25; 438/28
(58) Field of Search ............................ 250/552; 257/84, 257/85, 99, 603; 438/25, 28

(56) References Cited

U.S. PATENT DOCUMENTS 5,982,082 A * 11/1999 Janning ....................... 313/336

6,054,716 A * 4/2000 Sonobe et al. ............... 250/552

FOREIGN PATENT DOCUMENTS

| JP | 61-042868 A | 3/1986 |
| JP | 2-151086 A | 6/1990 |
| JP | 5-327021 A | 12/1993 |
| JP | 7-131072 A | 5/1995 |
| JP | 11-163409 | 6/1999 |
| JP | 11-174984 | 7/1999 |
| JP | 11-186590 A | 7/1999 |

OTHER PUBLICATIONS

Notice of Reasons of Rejection, Application No. 2001–5677005, Mailing date: Jul. 2, 2002.
International Search Report dated Jun. 19, 2001.

* cited by examiner

Primary Examiner—Hoai Ho
Assistant Examiner—Mai-Huong Tran
(74) Attorney, Agent, or Firm—McDermott, Will & Emery

(57) ABSTRACT

A flat panel display lighting system 20 includes: semiconductor light-emitting device 10; board 21; and light guide plate 22. The device 10 includes an inverted T-shaped substrate 1 having a base portion 1a, on which a pair of electrodes 2 and 3 are formed, and a mounting portion 1b, on which a light emitter 4 is mounted. The device 10 is mounted through the board 21 with the mounting portion 1b set through an opening 21a formed in the board 21. A light guide plate 22 is mounted on the board 21 so that a face of the plate 22 faces the light emitter 4. Each of the pair of electrodes 2 and 3 is formed on the substrate 1 of the device 10 so as to be electrically connected to the light emitter 4 and to a circuit pattern formed on the board 21.

3 Claims, 7 Drawing Sheets

SEMICONDUCTOR LIGHT EMITTER AND FLAT PANEL DISPLAY LIGHTING SYSTEM

TECHNICAL FIELD

The present invention relates to a semiconductor light-emitting device and a flat panel display lighting system using the semiconductor light-emitting device. More particularly, the semiconductor light-emitting device is usable as, for example, a backlighting source that irradiates a liquid crystal display with light through a light guide plate.

BACKGROUND ART

A display that utilizes a liquid crystal has been generally applied to electronic devices such as cellular phones. The display using the liquid crystal has a structure in which the liquid crystal display is sealed with the liquid crystal and a light emitter such as a light-emitting diode (LED) is used as a backlighting source to display an image. A semiconductor light-emitting device of edge-lighting type, for example, is known as a light-emitting device used as the backlighting source.

FIGS. 7(a) through 7(c) are respectively perspective view of a semiconductor light-emitting device used for a flat panel display lighting system of edge-lit type, side view and front view, of the flat panel display lighting system.

As shown in FIG. 7(a), a known semiconductor light-emitting device includes: blocklike insulating substrate 50; pair of electrodes 51a and 51b, each of which is disposed to cover each end of the front face (i.e., the face on which a light emitter is placed), a side face and the back face (which is opposite to the face on which the light emitter is placed), of the substrate 50; light emitter 52 bonded onto the electrode 51a with a conductive adhesive; wire 53, which electrically connects the electrode 51b to the light emitter 52; and resin package 54, which is made of an epoxy resin and molds, for example, the light emitter 52 and wire 53 together on the front face of the substrate 50.

As shown in FIGS. 7(b) and 7(c), the known flat panel display lighting system includes a board 55 on which the semiconductor light-emitting device and a light guide plate 56 of a polymer such as an acrylic polymer are disposed. The semiconductor light-emitting device is mounted on the board 55 and used as a backlighting source for a liquid crystal display 57. The board 55 has a wiring pattern (not shown) for establishing continuity to the electrodes 51a and 51b of the semiconductor light-emitting device. The light guide plate 56 is used for guiding light, emitted from the light emitter 52, to the liquid crystal display 57 and has a minute unevenness pattern on its bottom surface. Because of the existence of this minute unevenness pattern, light introduced into the edge of the light guide plate 56 is externally reflected toward the liquid crystal display 57. That is to say, light generated by the light emitter 52 of the semiconductor light-emitting device is introduced into the edge of the light guide plate 56. In other words, the light guide plate 56 is edge-lit. Thus, the light guide plate 56 functions as a backlighting source for the liquid crystal display 57 utilizing the light diffusion therein.

In such a surface-mounted flat panel display lighting system, the semiconductor light-emitting device is fixed onto the board 55 so as to be electrically connected to the electrode 51a and 51b and the wiring pattern using solders 58a and 58b. In this case, the height of the semiconductor light-emitting device is determined by the height (i.e., the vertical length shown in FIG. 7(a)) of the substrate 50. Specifically, the height of the light emitter 52 is set to be almost a half of that of the substrate 50.

Problems to be Solved

The substrate 50, however, has been diced so as to have a height and a thickness enough to retain the mechanical strength thereof. Therefore, the light emitter 52 is limited in height when mounted on the board 55. Thus, the thickness of the light guide plate 56 also needs to be set in accordance with the height of the light emitter 52. That is to say, to introduce light into almost the center of the edge face of the light guide plate 56, the light guide plate 56 needs to have its thickness increased or to be mounted slightly apart from the upper surface of the board 55. Accordingly, an unit made up of the flat panel display lighting system and liquid crystal display 57 has its thickness increased. As a result, the unit is less applicable to electronic devices such as cellular phones that have been tremendously downsized and thinned. In addition, the board 55 also has a space for the substrate 50, and thus has its area as well as its thickness increased inevitably. Therefore, it becomes difficult to downsize the resultant device.

Though not shown in FIGS. 7(b) and 7(c), circuits such as drive and detector circuits for the light emitter 52 are formed on the lower surface of the board 55. Thus, a solder reflow process step is required for such circuits on the lower surface of the board 55. Moreover, as an example shown in FIGS. 7(b) and 7(c), if the light emitter 52 is mounted on the upper surface of the board 55 and fixed thereto with solders 58a and 58b, another solder reflow process step is required on the upper surface of the board 55. Consequently, fabrication of the flat panel display lighting system includes two solder reflow process steps on the respective upper and lower surfaces of the board 55. As a result, the number of process steps and items of control inspection increase, and thus increase in fabricating cost and decrease in production yield might eventually occur.

DISCLOSURE OF INVENTION

It is therefore an object of the present invention to have a structure for backlighting a liquid crystal display downsized and thinned. It is another object of the present invention to provide a semiconductor light-emitting device and a flat panel display lighting system of high productivity by reducing, for example, the number of the fabricating process steps.

An inventive semiconductor light-emitting device includes: a substrate having a base portion, which extends laterally, and a mounting portion, which extends longitudinally from an area located in a middle part of the base portion and has an element placing area in a position apart from the base portion; a pair of electrodes formed on the base portion and the mounting portion of the substrate, one of the pair of electrodes extending from an end of the base portion, the other of the pair of electrodes extending from the other end of the base portion; a light emitter, which is placed on the electrode placing area of the mounting portion and is electrically connected to each of the pair of electrodes; and a transparent encapsulant, which molds at least the light emitter and each part of the pair of electrodes together.

In this device, the light emitter is disposed in an area of the mounting portion located away from the base portion of the substrate, and light emitted from the light emitter can be taken out from the area. Therefore, light emission suitable for application can be obtained. Specifically, the known semiconductor light-emitting device needs to be mounted on a board with its upper surface attached to the board by vacuuming using, for example, a vacuum jig. Thus, the area in the board where the device is attached using a suction nozzle is limited in position and the board itself is also limited to a minimum dimension. Further, since the substrate of the semiconductor light-emitting device is limited in thickness, the resin package is also limited in size and shape and the light emitter is also limited in location, for example. As a result, there is little flexibility in designing, and thus emission characteristics have to be sacrificed to some extent. In contrast, the inventive semiconductor light-emitting device can be mounted through the board with the lower surface of the base portion attached to the board by vacuuming using a vacuuming jig. Thus, the inventive semiconductor light-emitting device does not have limitations such as those found in the known semiconductor light-emitting device. As a result, flexibility in designing a shape of the resin package and a height of the light emitter increases, and more desirable emission characteristics can be obtained.

In addition, the mounting portion of the semiconductor light-emitting device can be made smaller than the overall substrate of the known semiconductor light-emitting device. Therefore, if a board through which a semiconductor light-emitting device is mounted has an adequate structure, the entire system can be downsized.

An inventive flat panel display lighting system includes: a board including a circuit pattern; an opening formed from the upper surface through the lower surface of the board in a region of the board other than a region on which the circuit pattern is formed; a light guide plate mounted over the upper surface of the board in a region other than the opening of the board; and a semiconductor light-emitting device including a substrate, which has a base portion extending laterally and a mounting portion extending longitudinally from an area located in a middle part of the base portion and having an element placing area in a position apart from the base portion, a pair of electrodes formed on the base portion and the mounting portion of the substrate, one of the pair of electrodes extending from an end of the base portion, the other of the pair of electrodes extending from the other end of the base portion, a light emitter, which is placed on the electrode placing area of the mounting portion and is electrically connected to each of the pair of electrodes, and a transparent encapsulant, which molds at least the light emitter and each part of the pair of electrodes together. The light emitter molded in the encapsulant faces a face of the light guide plate. Each of the pair of electrodes is electrically connected to the circuit pattern of the board.

In this system, since the height from the upper surface of the board to the top of the light emitter can be set lower than that of the known system, the thickness of the unit made up of the light guide plate and the board can be reduced. As a result, the flat panel display lighting system can be thinned. In addition, the upper surface of the board is not occupied by the semiconductor light-emitting device other than in the opening through which the mounted portion, molded with the encapsulant of the semiconductor light-emitting system, is set. As a result, the area of the upper surface of the board occupied by the semiconductor light-emitting device is reduced, thus downsizing the overall flat panel display lighting system.

In one embodiment of the present invention, the circuit pattern of the board may be formed on the lower surface of the board. Each of the pair of electrodes of the semiconductor light-emitting device may be formed on the upper surface of the board of the semiconductor light-emitting device. Each of the pair of electrodes of the semiconductor light-emitting device may be in contact with a part of the circuit pattern formed on the lower surface of the board and may be electrically connected to the circuit pattern. Then, a solder reflow process performed only on the lower surface of the board is enough to fabricate the flat panel display lighting system. As a result, the number of fabricating process steps decreases, thus reducing fabricating cost and increasing production yield.

BEST MODE FOR CARRYING OUT THE INVENTION

Structure of Semiconductor Light-Emitting Device

Figure 1:
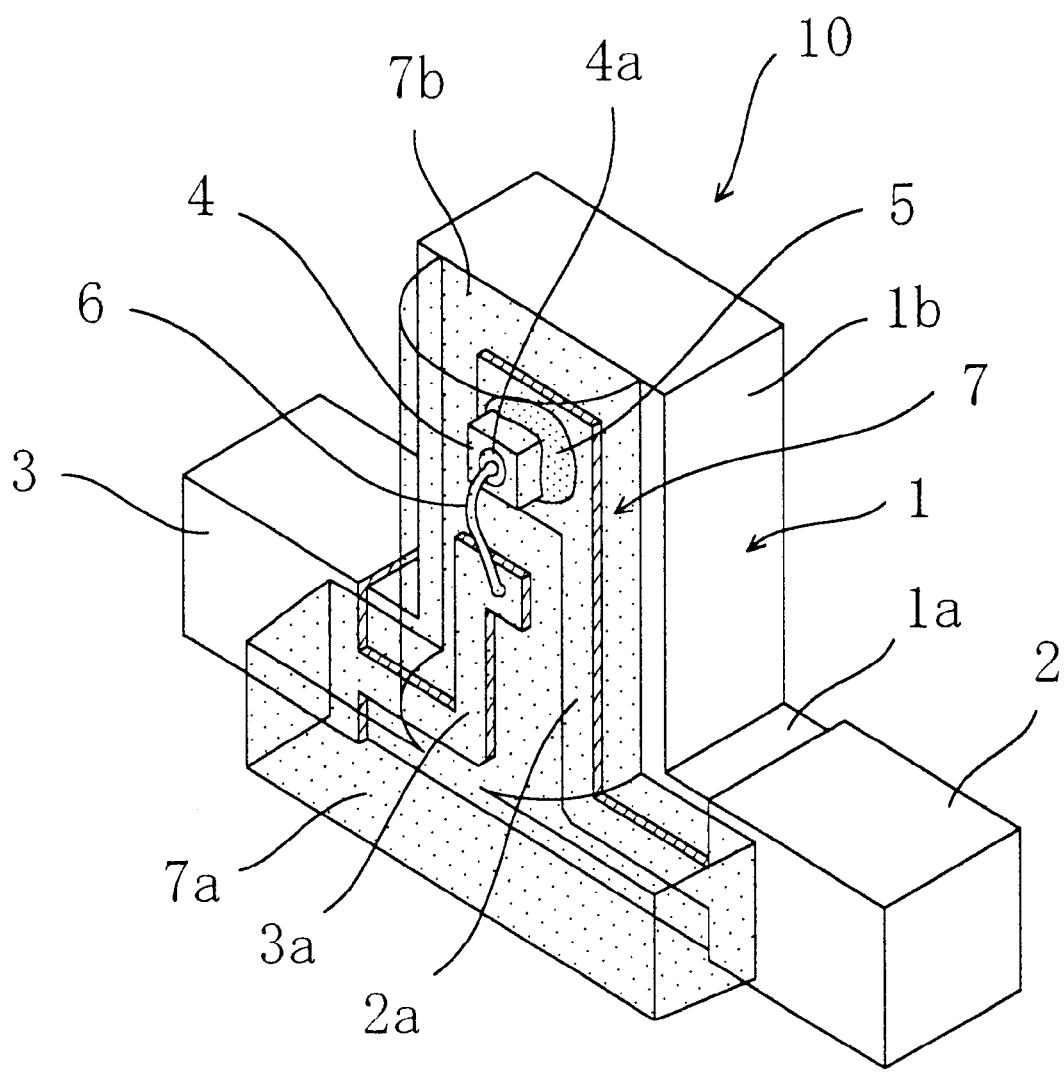
FIG. 1 is a perspective view illustrating an appearance of a structure of a semiconductor light-emitting device according to an embodiment of the present invention.
Figure 2A:
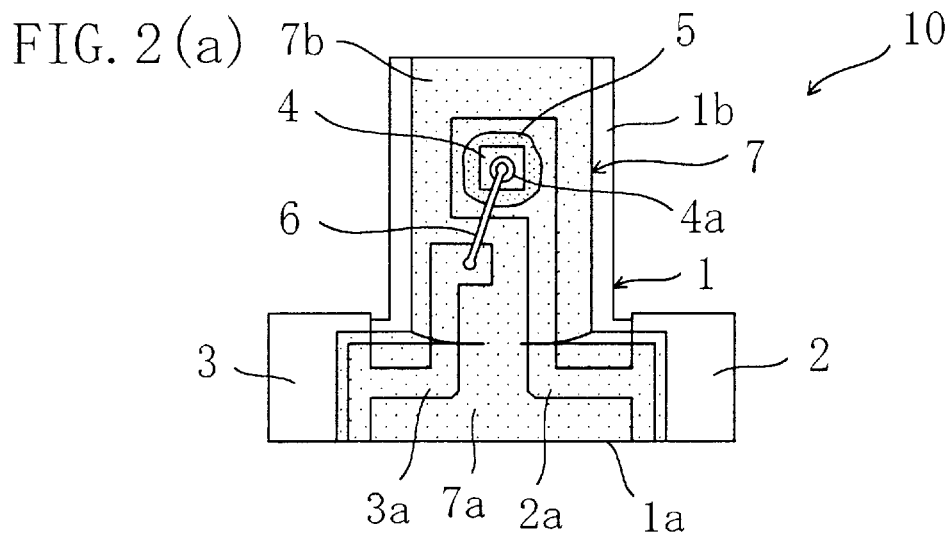
FIGS. 2(a) through 2(c) are respectively front view, side view and top view illustrating the semiconductor light-emitting device of the embodiment.
Figure 2B:
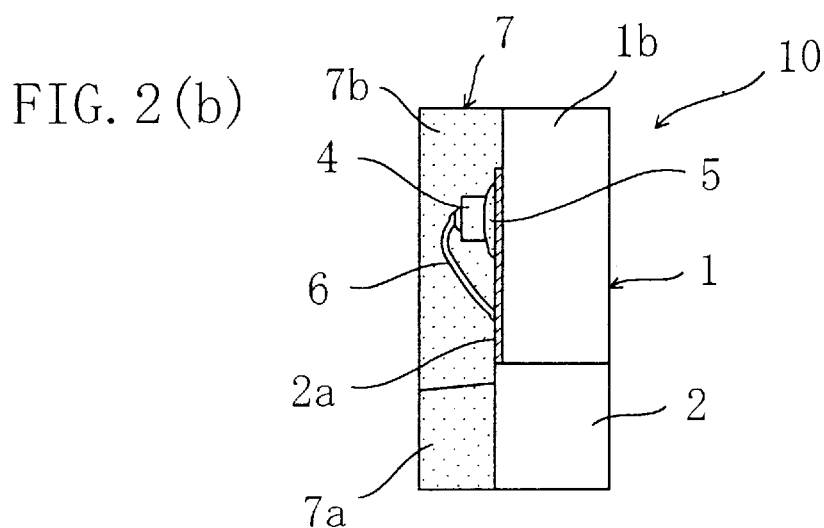
Figure 2C:
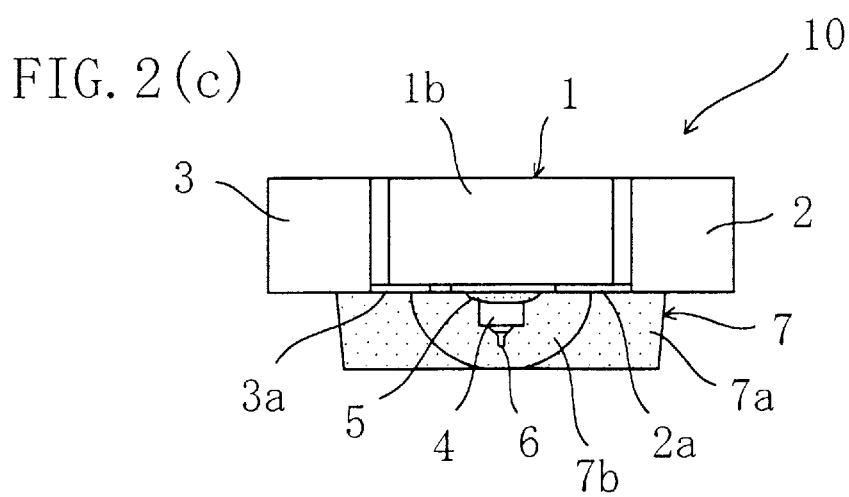

FIG. 1 is a perspective view illustrating an appearance of a semiconductor light-emitting device according to an embodiment of the present invention. FIGS. 2(a) through 2(c) are respectively front view (i.e., the face on which a light emitter is placed), side view and top view, of the semiconductor light-emitting device used for a flat panel display lighting system according to this embodiment.

As shown in FIGS. 1 and 2(a), a semiconductor light-emitting device 10 according to the present invention includes a substrate 1, which has an approximately inverted T-shaped cross-section and has a base portion 1a extending laterally and a mounting portion 1b extending longitudinally from the middle of the base portion 1a. The mounting portion 1b includes an element placing area (i.e., an area on which a light emitter is placed) in its front face and this area is located away from the base portion 1a by a distance (in an extent larger than the thickness of a board 21 shown in FIG. 3(a)). The substrate 1 is made of an insulating material and includes a pair of electrodes 2 and 3, each of which covers four faces other than the bottom face, i.e., front face, side face, top face and back face (the face opposite to the face on which the light emitter is placed), of the base portion 1a of the substrate 1 at each end thereof and also covers the front face of the mounting portion 1b. The electrodes 2 and 3 include extended wire part 2a and 3a, respectively, each of which extends from each end of the base portion 1a to reach the mounting portion 1b at its edge (i.e., a pad). The extended wire part 2a of the electrode 2 extends to the element placing area of the mounting portion 1b. A substrate (i.e., a portion to be an electrode) of a light emitter 4 such as a light-emitting diode or a semiconductor laser is fixed onto the pad located at the edge of the extended wire part 2a with a conductive adhesive 5 so as to be electrically connected to the electrode 2. The light emitter 4 includes an electrode 4a on its surface. The electrode 4a of the light emitter 4 and the pad (the edge) of the extended wire part 3a of the electrode 3 are electrically connected to each other with a bonding wire 6. The extended wire parts 2a and 3a of the electrodes 2 and 3, the light emitter 4 and the bonding wire 6 are molded together with a resin package 7 of an epoxy resin on the front faces of the base portion 1a and the mounting portion 1b of the substrate 1.

As shown in FIGS. 2(b) and 2(c), the resin package 7 includes a prismatic base portion 7a formed on the base portion 1a and an approximately semi-cylindrical convex lens 7b formed on the mounting portion 1b.

Structure of Flat Panel Display Lighting System

Figure 3A:
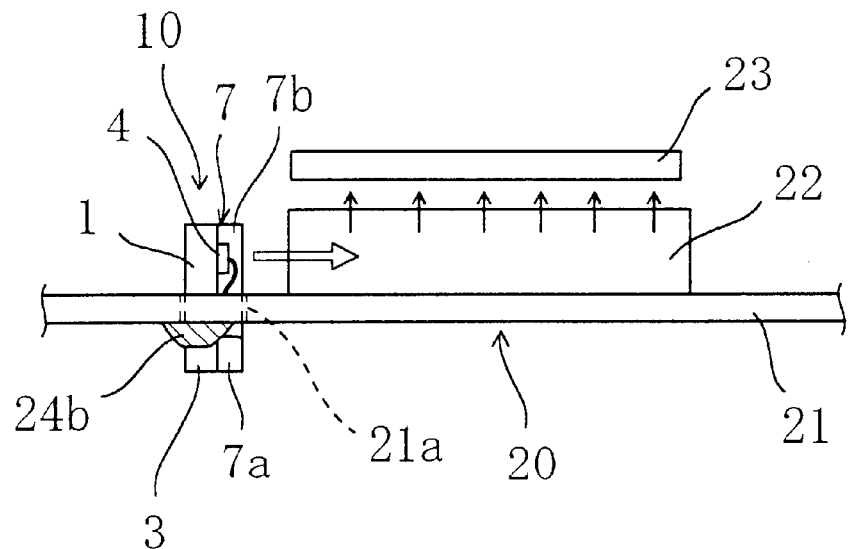
FIGS. 3(a) and 3(b) are respectively a side view and a front view illustrating a structure of a flat panel display lighting system using the semiconductor light-emitting device of the embodiment as a backlighting source for a liquid crystal display.
Figure 3B:
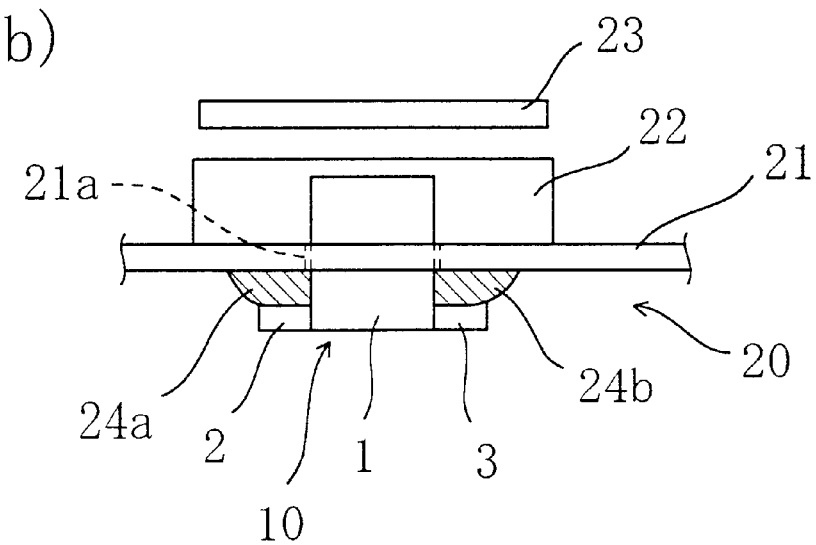
Figure 4:
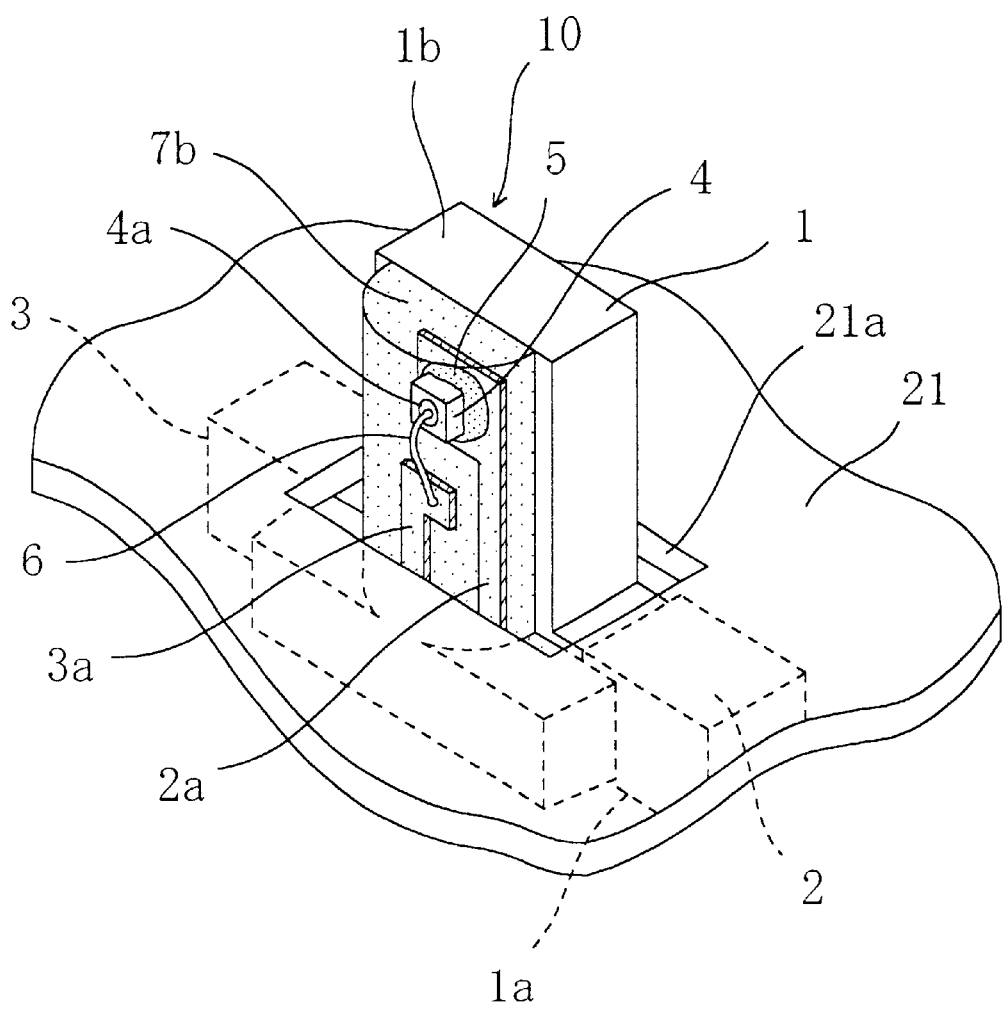
FIG. 4 is a perspective view illustrating a structure of a main portion of the flat panel display lighting system of the embodiment.

FIGS. 3(a) and 3(b) are respectively a side view and a front view illustrating a structure of a main portion of a flat panel display lighting system 20 using the semiconductor light-emitting device 10 of this embodiment as a backlighting source for a liquid crystal display. FIG. 4 is a perspective view illustrating a structure of a main portion of the flat panel display lighting system 20 of this embodiment.

As shown in FIGS. 3(a), 3(b) and 4, the flat panel display lighting system 20 of this embodiment includes: board 21; semiconductor light-emitting device 10 which has the above-described structure and is mounted on the board 21; and light guide plate 22 which is made of an acrylic polymer and mounted on the board 21 so as to face a light emitter 4 of the semiconductor light-emitting device. A liquid crystal display 23 is disposed over the light guide plate 22. A printed wiring pattern (not shown) to be connected to the electrodes 2 and 3 of the semiconductor light-emitting device 10 is formed on the lower surface of board 21. The board 21 has an opening 21a, which is large enough for the mounting portion 1b of the semiconductor light-emitting device 10 and the resin package 7 to pass therethrough, near the part of the board 21 on which the light guide plate 22 is mounted. The semiconductor light-emitting device 10 is mounted through the board 21 so that the mounting portion 1b thereof and the resin package 7 are set through the opening 21a of the board 21 and the base portion 1a thereof faces the lower surface of the board 21. In this case, each upper surface of the electrodes 2 and 3 located at each end of the base portion 1a of the semiconductor light-emitting device 10 is in contact with a terminal of the printed wiring pattern (i.e., a circuit pattern) formed on the lower surface of the board 21. The semiconductor light-emitting device 10 is fixed onto the lower surface of the board 21 with solders 24a and 24b. Each of the electrodes 2 and 3 of the semiconductor light-emitting device 10 is electrically connected to the terminal of the printed wiring pattern of the board 21.

In such a semiconductor light-emitting device mounted through the board 21, only the mounting portion 1b of the substrate 1 and the upper part that excludes the lower part of the resin package 7 protrude upward from the upper surface of the board 21. That is to say, in the known flat panel display lighting system shown in FIG. 7, the upper surface of the board 55 includes the total cross-sectional areas of the substrate 50 and resin package 54. On the other hand, in the flat panel display lighting system 20 of this embodiment, the upper surface of the board 21 includes only the area of the opening through which not the overall substrate 1 of the semiconductor light-emitting device 10 but only the mounting portion 1b thereof and the resin package 7 penetrate. Hence, the area of the board 21 occupied by the semiconductor light-emitting device and light guide plate 22 can be reduced. As a result, the resultant device can be downsized.

Figure 7A:
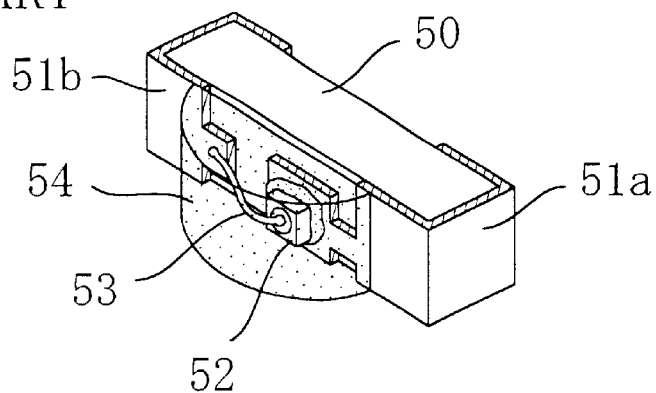
FIGS. 7(a) through 7(c) are respectively perspective view illustrating a structure of a known semiconductor light-emitting device used as a backlighting source, front view and side view of a known flat panel display lighting system using the semiconductor light-emitting device as a backlighting source for a liquid crystal display.
Figure 7B:
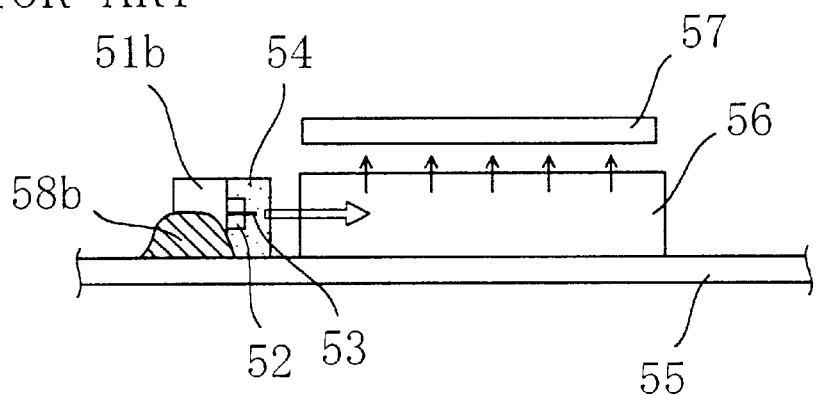
Figure 7C:
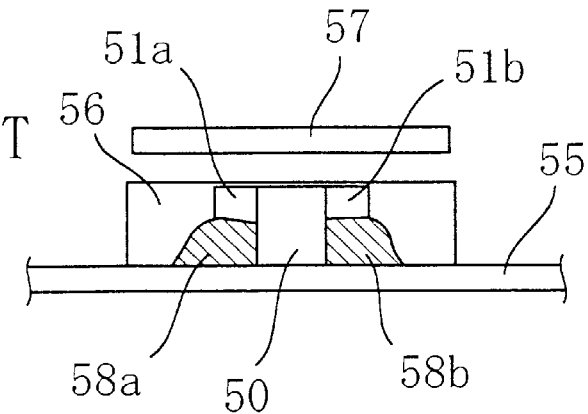

Specifically, if the known semiconductor light-emitting device and flat panel display lighting system shown in FIGS. 7(a) through 7(c) are adopted as a flat panel display lighting system used as a backlight for a liquid crystal display incorporated in, for example, cellular phones, the height, width and length of the substrate 50 of the semiconductor light-emitting device are 1.0 mm, 1.0 mm and 2.5 mm, respectively. The height of the light emitter (at its center) from the upper surface of the board 55 is 0.5 mm. The radius of the resin package 54 is about 0.6 mm. The thickness of the light guide plate 56 is about 1.0 mm. On the other hand, in the semiconductor light-emitting device 10 of this embodiment, the thickness, width and height of the mounting portion 1b of the board 1 is 0.5 mm, 1.6 mm, 1.6 mm, respectively. The radius of the resin package 7 is about 0.6 mm. The height of the light emitter 4 (at its center) from the upper surface of the board 21 is 0.3 mm in the flat panel display lighting system 20. The thickness of the light guide plate 22 is about 0.6 mm. In each of the known and the inventive flat panel display lighting systems, the thickness of the board is about 1.0 mm.

In the known flat panel display lighting system, the area of the upper surface of the board 55 occupied by the semiconductor light-emitting device is 3.07 mm$^2$ (=2.5×1+ (½)×3.14×0.6$^2$). On the other hand, in the inventive flat panel display lighting system 20, the area of the upper surface of the board 21 required for the semiconductor light-emitting device 10 is equal to the area of the opening, i.e., about 1.76 mm$^2$ (=1.6×(0.5+0.6)). That is to say, in the present invention, an area of a board required to mount the semiconductor light-emitting device thereon can be reduced.

In addition, since the light emitter 4 protrudes upward from the upper surface of the board 21, the light guide plate 22 can be irradiated with light emitted from the light emitter 4. Further, the strength of the substrate 1 of the semiconductor light-emitting device 10 can be retained by the base portion 1a. Therefore, so long as the mounting portion 1b is set through the opening of the board 21 with the light emitter 4 protruding upward from the upper surface of the board 21, even if the light emitter 4 is located at a level near the upper surface of the board 21, i.e., at a relatively low level, the light guide plate 22 can be irradiated with light. Accordingly, the protrusion height of the mounting portion 1b of the semiconductor light-emitting device 10 from the upper surface of the board 21 can be reduced. Further, since the light emitter 4 can be located at a level near the upper surface of the board 21, the thickness of the light guide plate 22 that faces the light emitter 4 can be reduced. Accordingly, the respective heights of the semiconductor light-emitting device 10 and light guide plate 22 from the upper surface of the board 21 can also be decreased. As a result, the thickness of the unit, made up of the flat panel display lighting system 20 and liquid crystal display 23, can be reduced.

In the known flat panel display lighting system, the thickness of the board 55 and light guide plate 56 is 2 mm in total. On the other hand, in the inventive flat panel display lighting system 20, the thickness of the board 21 and light guide plate 22 is 1.6 mm in total. That is to say, in the inventive system, the thickness of the unit, made up of the flat panel display lighting system and the liquid crystal display, can be reduced.

Further, while the approximately rectangular-prism-shaped semiconductor light-emitting device of the known system is mounted on the board, the mounting portion of the inventive semiconductor light-emitting device is set through the opening of the board. As a result, the inventive semiconductor light-emitting device can be fixed onto the board firmly and steadily.

The electrodes 2 and 3 formed on the board 1 of the semiconductor light-emitting device 10 are bonded with the solders 24a and 24b onto the lower surface of the board 21, on which circuits including a detector circuit or other circuits (not shown) are formed. Therefore, unlike the known flat panel display lighting system shown in FIG. 7, two solder reflow process steps, i.e., a step of soldering the electrodes 51a and 51b of the semiconductor light-emitting device onto the upper surface of the board 55 and a step of soldering a chip including circuits such as a detector circuit onto the lower surface of the board 55, are not required in the inventive system. That is to say, only one solder reflow process step is required for soldering the electrodes 2a and 2b of the semiconductor light-emitting device 10 and a chip, including, for example, a detector circuit, onto the lower surface of the board 21. As a result, in this embodiment, the number of process steps can be reduced, and the productivity improves.

Process Steps for Fabricating Semiconductor Light Emitter

FIGS. 5(a) through 6(b) are perspective views showing process steps for fabricating a semiconductor light-emitting device according to this embodiment.

Figure 5A:
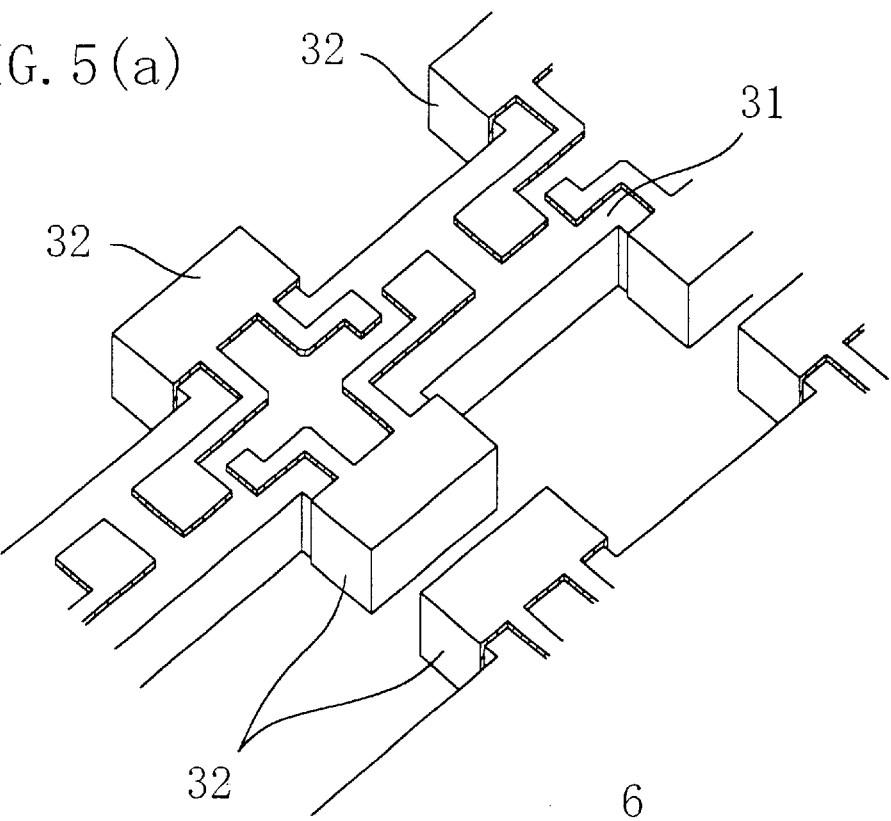
FIGS. 5(a) and 5(b) are perspective views showing process steps of a process for fabricating the semiconductor light-emitting device of the embodiment performed before a wire bonding process step is performed.
Figure 5B:
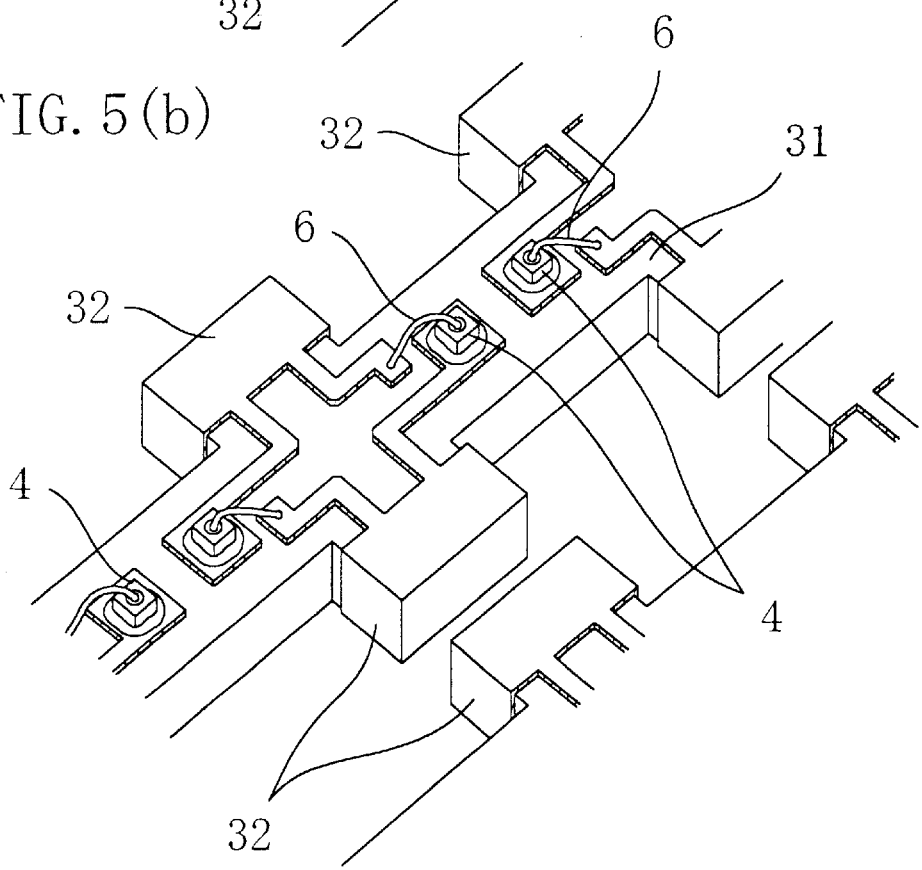

First, in the process step shown in FIG. 5(a), electrode base patterns 32 to be electrodes 2a and 3a are formed on each base 31, which has been patterned into a predetermined shape beforehand and will be substrates. A plurality of the bases 31 are connected together with frame members, which are not shown, and processed at a time to have the same shape. Then, in the process step shown in FIG. 5(b), light emitters 4 are mounted on respective areas corresponding to extended wire parts 2a of the electrodes 2 and fixed onto the extended wire parts 2a with a conductive adhesive so as to be electrically connected thereto. Thereafter, electrodes 4a of the light emitters 4 are connected to respective areas corresponding to extended wire parts 3a of the electrodes 3 with bonding wires 6 by a wire bonding process.

Figure 6A:
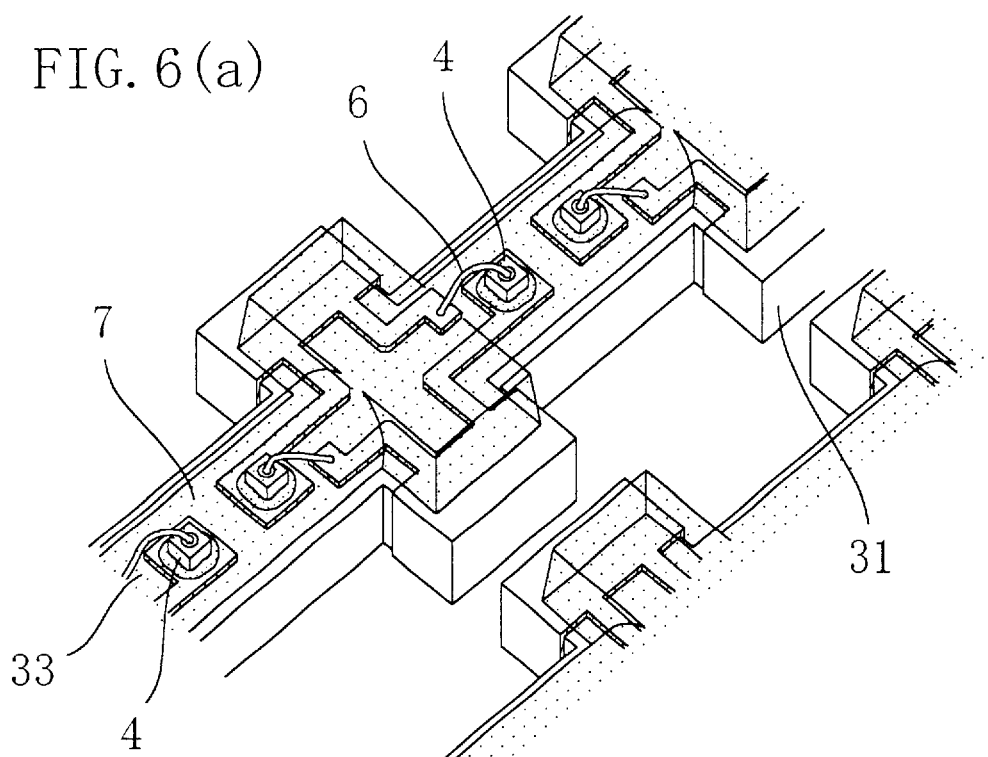
FIGS. 6(a) and 6(b) are perspective views showing process steps of a process for fabricating the semiconductor light-emitting device of the embodiment from a resin molding process step through a dicing process step.
Figure 6B:
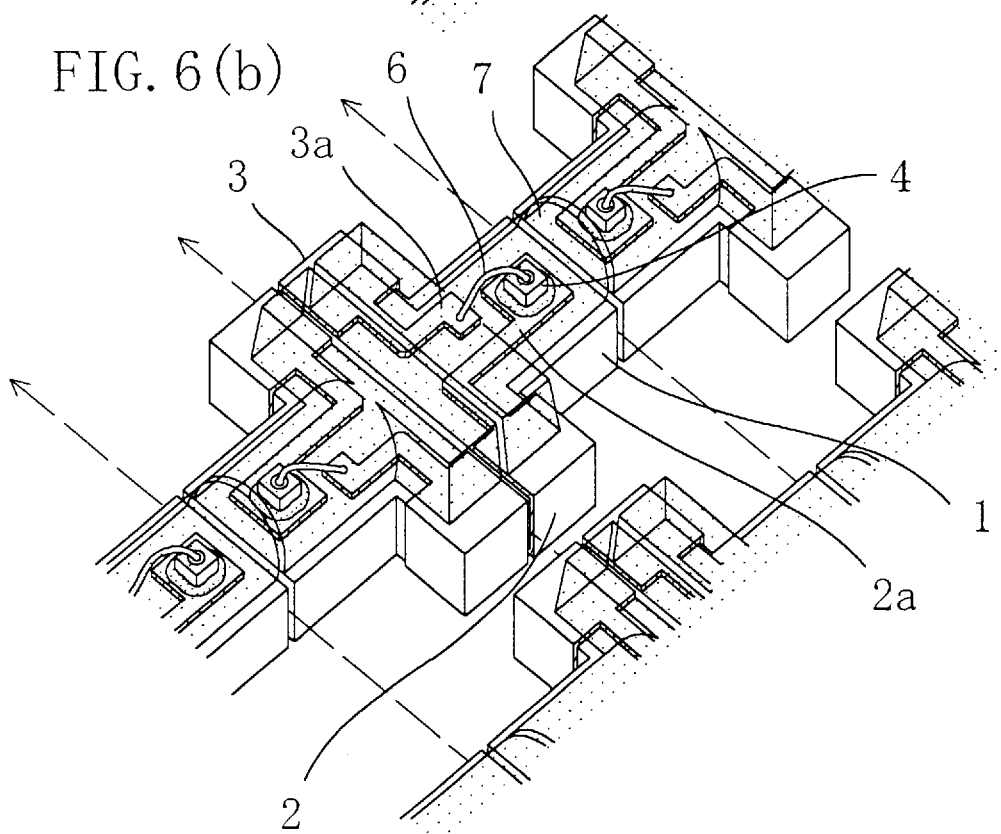

Next, in the process step shown in FIG. 6(a), the light emitters 4, electrodes 4a thereof, extended wire parts 2a and 3a of the electrodes 2 and 3 and bonding wires 6 all of which are located over the upper surface of the base 31 are molded together with a resin encapsulant 33. Then, the resin encapsulant 33 is cured. Thereafter, in the process step shown in FIG. 6(b), the base is diced in the direction indicated by the illustrated broken lines, thereby obtaining the semiconductor light-emitting devices 10 as shown in FIG. 1.

According to the fabrication process steps of this embodiment, it is possible to fabricate a semiconductor light-emitting device 10 including a substrate 1 which does not have a known rectangular-prism-shape but has an approximately inverted T-shaped cross-section by a simplified process.

In this embodiment, the semiconductor light-emitting device includes only one light emitter. Alternatively, the device may include a plurality of light emitters.

The substrate 1 of the semiconductor light-emitting device 10 is not necessarily formed in such a shape that the mounting portion 1b extends from substantially the middle of the base portion 1a, i.e., in a symmetrical shape. Even if the semiconductor light-emitting device 10 does not have such a shape, the device 10 can be fixed onto the board 21 with the mounting portion 1b set through the opening of the board 31.

In this embodiment, the light emitter is fixed onto the extended wire part 2a of the electrode 2 and electrically connected thereto. Alternatively, two electrodes may be extended from the light emitter so as to be respectively connected to the extended wire parts 2a and 3a of the electrodes 2 and 3 with bonding wires.

If the light emitter includes two electrodes on its lower surface, the electrodes 2 and 3 of the substrate 1 shown in FIG. 1 may extend to the element placing area so as to be electrically connected to the respective two electrodes of the light emitter via bumps. That is to say, a "flip-chip bonding structure" may be adopted. In particular, if the substrate is made of a transparent material, e.g., is a sapphire substrate, the emitted light can be taken out through the substrate. Therefore, the flip-chip bonding structure is preferable in that case.

In this embodiment, a resin package is used as an encapsulant. However, an encapsulant used in the present invention is not limited to the one used in this embodiment. For example, an encapsulant made of an inorganic material such as a glass or a silicon oxide may be used.

The light emitter of the present invention may be a light-emitting diode using an AlGaAs layer as the active region, a semiconductor laser, or a light-emitting diode (blue-light emitting diode) using a GaN layer as the active layer. For example, a semiconductor laser may be used as a light emitter and a prism may be disposed as a light guide plate.

INDUSTRIAL APPLICABILITY

The present invention is applicable to a flat panel display lighting system used as a backlighting source for a liquid crystal display and also applicable to a semiconductor light-emitting device to be incorporated into the flat panel display lighting system.

What is claimed is:

1. A semiconductor light-emitting device comprising:
   a substrate having a base portion, which extends laterally, and a mounting portion, which extends longitudinally from an area located in a middle part of the base portion and has an element placing area in a position apart from the base portion;
   a pair of electrodes formed on the base portion and the mounting portion of the substrate, one of the pair of electrodes extending from an end of the base portion, the other of the pair of electrodes extending from the other end of the base portion;
   a light emitter, which is placed on the electrode placing area of the mounting portion and is electrically connected to each of the pair of electrodes; and
   a transparent encapsulant, which molds at least the light emitter and each part of the pair of electrodes together.

2. A flat panel display lighting system comprising:
   a board including a circuit pattern;

an opening formed from the upper surface through the lower surface of the board in a region of the board other than a region on which the circuit pattern is formed;

a light guide plate mounted over the upper surface of the board in a region other than the opening of the board; and a semiconductor light-emitting device including a substrate, which has a base portion extending laterally and a mounting portion extending longitudinally from an area located in a middle part of the base portion and having an element placing area, a pair of electrodes formed on the base portion and the mounting portion of the substrate, one of the pair of electrodes extending from an end of the base portion, the other of the pair of electrodes extending from the other end of the base portion, a light emitter, which is placed on the electrode placing area of the mounting portion and is electrically connected to each of the pair of electrodes, and a transparent encapsulant, which molds at least the light emitter and each part of the pair of electrodes together, wherein the light emitter molded in the encapsulant faces a face of the light guide plate, and wherein each of the pair of electrodes is electrically connected to the circuit pattern of the board.

3. The system of claim 2, wherein the circuit pattern of the board is formed on the lower surface of the board, wherein each of the pair of electrodes of the semiconductor light-emitting device is formed on the upper surface of the board of the semiconductor light-emitting device, and wherein each of the pair of electrodes of the semiconductor light-emitting device is in contact with a part of the circuit pattern formed on the lower surface of the board and is electrically connected to the circuit pattern.

* * * * *

UNITED STATES PATENT AND TRADEMARK OFFICE
CERTIFICATE OF CORRECTION

PATENT NO. : 6,597,018 B2
DATED : July 22, 2003
INVENTOR(S) : Masami Nei

It is certified that error appears in the above-identified patent and that said Letters Patent is hereby corrected as shown below:

<u>Title page,</u>
Item [56], References Cited, OTHER PUBLICATIONS, replace "2001-5677005" with -- 2001-567055 --

Signed and Sealed this

Twenty-third Day of March, 2004

JON W. DUDAS
*Acting Director of the United States Patent and Trademark Office*